United States Patent
Sun et al.

(10) Patent No.: US 12,107,073 B2
(45) Date of Patent: Oct. 1, 2024

(54) DISPLAY DEVICE AND METHOD FOR BONDING THE SAME

(71) Applicants: Beijing BOE Display Technology Co., Ltd., Beijing (CN); BOE Technology Group Co., Ltd., Beijing (CN)

(72) Inventors: Zhihua Sun, Beijing (CN); Yanping Liao, Beijing (CN); Seungmin Lee, Beijing (CN); Qiujie Su, Beijing (CN); Feng Qu, Beijing (CN); Yingmeng Miao, Beijing (CN); Xibin Shao, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 507 days.

(21) Appl. No.: 17/429,929

(22) PCT Filed: Oct. 27, 2020

(86) PCT No.: PCT/CN2020/123952
§ 371 (c)(1),
(2) Date: Aug. 10, 2021

(87) PCT Pub. No.: WO2022/087816
PCT Pub. Date: May 5, 2022

(65) Prior Publication Data
US 2022/0310560 A1    Sep. 29, 2022

(51) Int. Cl.
*H01L 25/065* (2023.01)
*H01L 25/00* (2006.01)
*H01L 23/12* (2006.01)

(52) U.S. Cl.
CPC .......... *H01L 25/0655* (2013.01); *H01L 25/50* (2013.01); *H01L 23/12* (2013.01)

(58) Field of Classification Search
CPC .................................................... H01L 25/0753
See application file for complete search history.

(56) References Cited

U.S. PATENT DOCUMENTS

| | | | |
|---|---|---|---|
| 11,721,667 B2 * | 8/2023 | Kim | G09F 9/301 |
| | | | 361/749 |
| 2004/0257516 A1 | 12/2004 | Sugimoto et al. | |
| 2005/0285836 A1 | 12/2005 | Hwang et al. | |
| 2006/0268213 A1 | 11/2006 | Kang et al. | |
| 2007/0030435 A1 | 2/2007 | Cheng et al. | |
| 2008/0117376 A1 | 5/2008 | Takenaka | |
| 2017/0271299 A1 * | 9/2017 | Li | H01L 24/83 |

FOREIGN PATENT DOCUMENTS

| | | |
|---|---|---|
| CN | 1570718 A | 1/2005 |
| CN | 1605903 A | 4/2005 |
| CN | 101187735 A | 5/2008 |

* cited by examiner

*Primary Examiner* — Yu-Hsi D Sun
(74) *Attorney, Agent, or Firm* — IPro, PLLC

(57) ABSTRACT

A display device and a method for bonding the display device are provided. The display device includes a display panel and a plurality of chip on films. The plurality of chip on films are arranged along a first edge of the display panel, and are divided into a plurality of groups of chip on films, and each group of chip on films includes at least two chip on films, and is bonded to the display panel through a same anisotropic conductive film.

20 Claims, 1 Drawing Sheet

DISPLAY DEVICE AND METHOD FOR BONDING THE SAME

CROSS-REFERENCE TO RELATED APPLICATION

The present application is the U.S. national phase of PCT Application No. PCT/CN2020/123952 filed on Oct. 27, 2020, the disclosure of which is incorporated herein by reference in its entirety.

TECHNICAL FIELD

The present disclosure relates to the field of display technologies, in particular to a display device and a method for bonding the display device.

BACKGROUND

Along with the development of display technology, a high-resolution display device is welcomed by users due to a higher resolution and better visual experience. However, in order to provide data signals required by the high-resolution display device, more chip on films (COFs) are needed, and, due to limitation of a size of the display device, a bonding effect between the COFs and the display panel is affected adversely when the number of COFs is increased, which may affect the reliability of the display device adversely.

SUMMARY

Embodiments of the present disclosure provide a display device and a method for bonding the display device, so as to solve such a problem that because a bonding effect between a COF and the display panel is affected adversely, the reliability of the display device may be affected adversely.

In a first aspect, the embodiments of the present disclosure provide a display device including a display panel and a plurality of chip on films arranged along a first edge of the display panel, the plurality of chip on films being divided into a plurality of groups of chip on films, and each group of chip on films including at least two chip on films, and being bonded to the display panel through a same anisotropic conductive film.

In some embodiments, the number of groups of chip on films is an even number, the number of chip on films in each group of chip on films is equal, and the plurality of groups of chip on films are symmetrically distributed about a perpendicular bisector of the first edge.

In some embodiments, a diagonal length of a display area of the display panel is not greater than 60 inches, the number of pixels of the display panel in a first direction is greater than the number of pixels in a second direction, the first direction and the second direction are perpendicular to each other, and the number of pixels in the first direction is not less than 7600.

In some embodiments, the total number of chip on films is 24, and the number of chip on films in each group of chip on films is two or three.

In some embodiments, in a same group of the chip on films, a distance between two adjacent chip on films is 3.8 mm to 4.2 mm.

In some embodiments, in the same group of the chip on films, the distance between the two adjacent chip on films is 4 mm.

In some embodiments, in a case where each group of chip on films includes two chip on films, a minimum distance between chip on films of different groups is less than 13 mm and greater than 12.5 mm.

In some embodiments, the minimum distance between the chip on films of the different groups is 12.8 mm.

In some embodiments, in a case where each group of chip on films includes three chip on films, a minimum distance between chip on films of different groups is less than 17.5 mm and greater than 17 mm.

In some embodiments, the minimum distance between chip on films of the different groups is 17.2 mm.

In some embodiments, a minimum distance between two adjacent anisotropic conductive films is greater than 8 mm and less than 9 mm.

In some embodiments, a minimum distance between two adjacent anisotropic conductive films is 8.8 mm.

In a second aspect, embodiments of the present disclosure provide a method for bonding a display device, the display device includes a display panel and a plurality of chip on films, and the method includes: bonding the chip on films to the display panel. The plurality of chip on films are arranged along a first edge of the display panel, the plurality of chip on films are divided into a plurality of groups of chip on films, and each group of chip on films includes at least two chip on films, and is bonded to the display panel through a same anisotropic conductive film.

In some embodiments, the bonding the chip on films to the display panel includes: bonding each group of chip on films to the display panel by using one indenter through one pressing.

In the technical solution of the embodiments of the present disclosure, the plurality of chip on films are divided into the plurality of groups of chip on films, and each group of chip on films is bonded to the display panel through the same anisotropic conductive film, so as to reduce the distance between the chip on films in the same group, and achieve an effect of saving space. Thus, when a size of the display panel is fixed, it is able to increase an operation space of a bonding operation, so as to improve a bonding effect and help to improve the reliability of the display panel.

BRIEF DESCRIPTION OF THE DRAWINGS

In order to illustrate the technical solutions of the embodiments of the present disclosure in a clearer manner, the drawings required for the description of the embodiments of the present disclosure will be described hereinafter briefly. Obviously, the following drawings merely relate to some embodiments of the present disclosure, and based on these drawings, a person of ordinary skill in the art may obtain other drawings without any creative effort.

DETAILED DESCRIPTION

The technical solutions in the embodiments of the present disclosure will be described hereinafter clearly and completely with reference to the drawings of the embodiments of the present disclosure. Obviously, the following embodiments merely relate to a part of, rather than all of, the embodiments of the present disclosure, and based on these embodiments, a person of ordinary skill in the art may, without any creative effort, obtain other embodiments, which also fall within the scope of the present disclosure.

The present disclosure provides a display device.

In one embodiment, the display device includes a display panel and a plurality of COFs (Chip On Flex or Chip On Film). The plurality of COFs are arranged along a first edge of the display panel, and divided into a plurality of groups of chip on films, and each group of COFs includes at least two COFs, and is bonded to the display panel through a same anisotropic conductive film (ACF).

The technical solution of the embodiment is mainly applied to a display device having a relatively small size and a relatively high resolution, and it should be appreciated that, when the resolution of the display panel is fixed, the smaller the size of the display panel, the greater the number of pixels per unit area and the higher the exquisite degree and refinement degree of an image.

A display panel having a resolution of 7680*4320 is taken as an example, when the size of the display panel is 55 inches, the number of pixels per unit area thereof is about 40% greater than that of a display panel of 65 inches, and therefore, in the case of a fixed resolution, the smaller the size of the display surface, the higher the exquisite degree and refinement degree of the image.

The higher the resolution of the display panel, the greater the number of data signals that need to be provided. Accordingly, more COFs need to be provided. In the case of the display panel having the relatively small size, a space available to accommodate the COFs is relatively small.

The COFs are usually bonded to the display panel through a pressing operation of an indenter, and the indenter itself requires a certain operation space having a size larger than that of the pressed COF. For example, when the COF has a length of 42 mm, a length of the indenter is at least 48 mm. The COFs are bonded to the display panel through the ACFs, so as to achieve an electrical connection of the COFs to the display panel. In order to ensure the reliability of the electrical connection, a size of the ACF also needs to be larger than that of the COF. However, in order to ensure a product performance, there should be no overlap between ACFs, and there should be a certain spacing between COFs.

Figure 1:
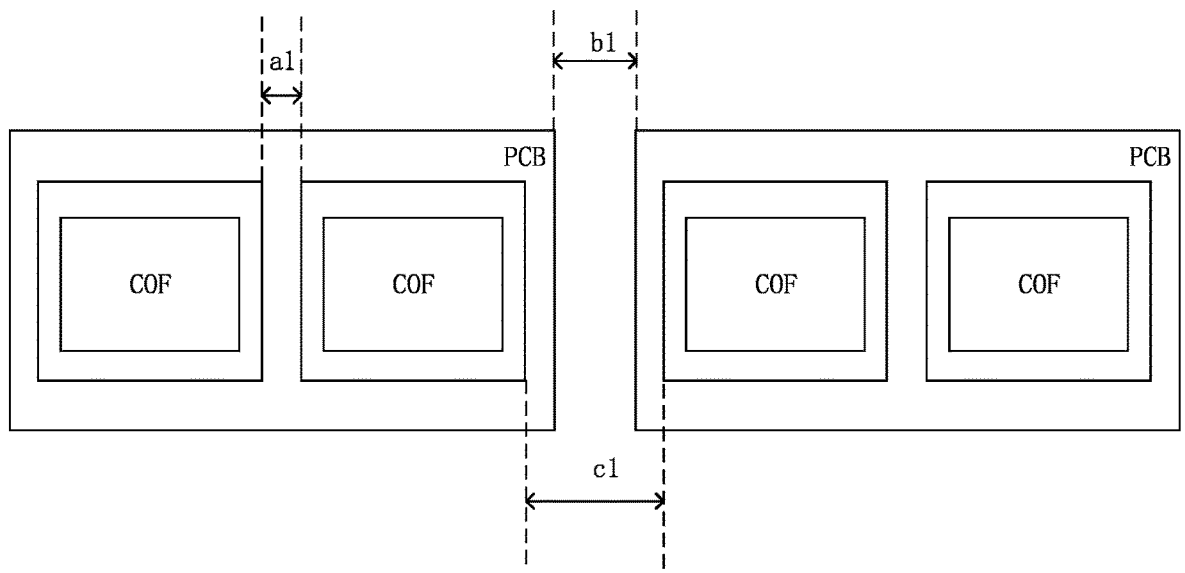
FIG. 1 is a schematic structural diagram of a display device according to an embodiment of the present disclosure.

As shown in FIG. 1, in one embodiment of the present disclosure, the plurality of COFs are divided into the plurality of groups of chip on films, and each group of COFs includes at least two COFs, and is bonded to the display panel through the same ACF.

It should be appreciated that, a distance between adjacent ACFs is constant, and in order to avoid the overlapping of ACFs, the greater the number of ACFs, the more additional space required to be occupied. In the technical solution of the embodiment, because the plurality of COFs are bonded to the display panel through the same ACF, the number of ACFs used is reduced. In addition, the occupied space is reduced, so as to improve a space utilization, and provide more COFs at a fixed size.

In the embodiments of the present disclosure, each group of COFs is bonded to the display panel through the same ACF, so as to reduce the distance between COFs in the same group, and achieve the effect of saving space. Therefore, the operation space of the bonding operation is increased when the size of the display panel is fixed, so as to improve the binding effect and facilitate improving the reliability of the display panel.

In some embodiments, the number of groups of COFs is an even number, the number of COFs in each group of COFs is equal, and the plurality of groups of COFs are symmetrically distributed about a perpendicular bisector of the first edge.

The COFs is bonded to the display panel at a fan-out region, and a position distribution of the COFs may affect a resistance between the COFs and the fan-out region. In the embodiment, the COFs are divided into even groups of chip on films, and the number of COFs in each group of COFs is equal, and the plurality of groups of COFs are symmetrically distributed. Thus, a resistance difference in the fan-out region of the display panel may be reduced, and a corresponding resistance of each COF is substantially equal, so as to improve the reliability and stability of the display panel.

In some embodiments, a diagonal length of a display area of the display panel is not greater than 60 inches. For example, in one embodiment, the diagonal length of the display panel may be 55 inches, with the display panel having a length of about 121.76 cm and a width of about 68.49 cm.

The number of pixels of the display panel in a first direction is greater than the number of pixels in a second direction, the first direction and the second direction are perpendicular to each other, and the number of pixels in the first direction is not less than 7600.

It should appreciated that, the technical solution of the embodiment may be applied to a larger sized display panel, and the larger sized display panel may provide more space for the COFs.

For example, in a case where the resolution of the display panel is 7680*4320, and a diagonal length thereof is 65 inches, a length thereof is about 143.9 cm, which is sufficiently long along a length direction, so as to satisfy the space required for the COFs when each COF is arranged individually.

While for the display panel having the relatively small size, such as the display panel having a diagonal length of 55 inches and a length of only 121.76 cm, the number of COFs required to be configured is the same for a same resolution, resulting in a relatively small space allocated to each COF, and potentially affecting the reliability of the display panel.

In some embodiments, the total number of COFs is 24, and the number of COFs in each group of chip on films is two or three.

In the embodiment, a total of 97+960+97 connection terminals are provided in order to provide data signals required for high resolution while taking into account the current withstanding capability of the connection terminals (pins), of which 960 connection terminals are data terminals for providing the data signals, and two groups each of 97 connection terminals are dummy terminals provided on both sides of the data terminals. That is, the connection terminals include two groups each of 97 dummy terminals and 960 data terminals, and are arranged in an order of 97 dummy terminals, 960 data terminals and 97 dummy terminals. A total of 1154 connection terminals are provided on each COF.

The connection terminals are provided on the COFs, the number of the COFs is 24, and 24 COFs are divided into groups of COFs, two or three COFs for each group, that is, the 24 COFs are divided into 12 groups of COFs, two COFs for each group, or divided into eight groups of COFs, three COFs for each group.

A length of each COF is 42 mm, where a length of a region for arranging the connection terminals is about 40 mm, and a total of 1154 connection terminals are arranged on each COF, so that a width of the space occupied by each connection terminal is about 34.7 μm, which may be rounded to 35 μm for the convenience of calculation, thereby to obtain a total length of 1154 connection terminals of about 40.39 mm.

It should be appreciated that a length direction of the connection terminal is parallel to a width direction of the COF, and the plurality of connection terminals are arranged at intervals in the length direction of the COFs. Thus, the width of the space occupied by each connection terminal actually includes a width of each connection terminal and an interval distance between two adjacent connection terminals.

Because the number of intervals between the connection terminals is one less than the number of connection terminals, the total length of the connection terminals is determined to be about 40.355 mm after the total length of the connection terminals is corrected according to a width of the interval.

In some embodiments, in a same group of COFs, a distance between two adjacent COFs is 3.8 mm to 4.2 mm.

When the distance between COFs is too small, mutual interference may occur, and when the distance between COFs is too large, a large space may be occupied, resulting in failure of normal arrangement of the plurality of COFs. Therefore, in the embodiment, the distance between two adjacent COFs in the same group is controlled to be 3.8 mm to 4.2 mm. In one embodiment, when ignoring the error, an interference between adjacent COFs may be avoided by specifically controlling the distance between adjacent COFs in the same group to be 4 mm.

The bonding process of the display panel and the COFs actually includes bonding the COFs to a circuit board (Printed Circuit Board, PCB) of the display panel through the ACF. Each group of COFs corresponds to one circuit board. In order to avoid mutual interference between the circuit boards, it is also necessary to control a distance between the circuit boards. In the embodiment of the present disclosure, the distance between the circuit boards is not less than 3.8 mm and not greater than 4.5 mm, and it is specifically controlled to be 4 mm in one embodiment, so as to ensure that the circuit boards do not interfere with each other and avoid occupation of excessive space.

As shown in FIG. 1, in some embodiments, each group of COFs includes two COFs.

In the embodiment, the distance a1 between two adjacent COFs in the same group is 4 mm, the distance b1 between two circuit boards corresponding to different groups of COFs is 4 mm, and a minimum distance c1 between the COFs located in different groups is less than 13 mm and greater than 12.5 mm. In one embodiment, the minimum distance c1 the COFs located in different groups is 12.8 mm. In embodiment, a distance between the ACF and an edge of the circuit board is about 4.4 mm.

As shown in FIG. 1, in the technical solution of the embodiment, the length d1 of each COF is 42 mm, the distance a1 between two adjacent COFs in the same group is 4 mm, and the distance between the ACF and the edge of the circuit board is about 4.4 mm. In this way, a width of the circuit board corresponding to each group of COFs is about 96.8 mm, and the distance b1 between two adjacent circuit boards is 4 mm, a total length occupied by the circuit boards corresponding to the twelve groups of COFs is 120.56 cm, which is less than the length of 121.76 cm of the 55-inch display panel.

Figure 2:
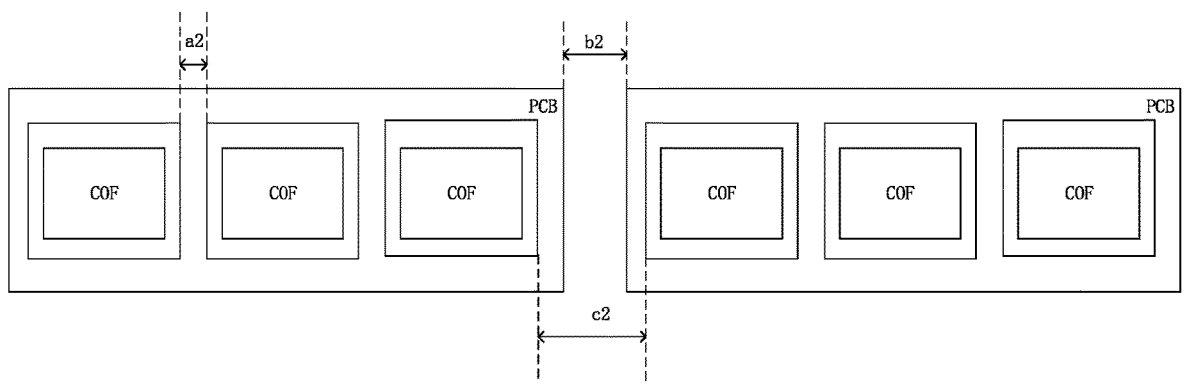
FIG. 2 is another schematic structural diagram of the display device according to an embodiment of the present disclosure.

As shown in FIG. 2, in other embodiments, each group of COFs includes three COFs.

In embodiment, the distance a2 between two adjacent COFs in the same group is 4 mm, the distance b2 between two circuit boards corresponding to different groups of COFs is 8.8 mm, and the minimum distance c2 between COFs located in different groups is less than 17.5 mm and greater than 17 mm. In one embodiment, the minimum distance c2 between the COFs located in different groups is 17.2 mm. In embodiment, the distance between the ACF and the edge of the circuit board is about 4.2 mm.

As shown in FIG. 2, in the technical solution of the embodiment, the length d2 of each COF is 42 mm, the distance a2 between the two adjacent COFs in the same group is 4 mm, and the distance between the ACF and the edge of the circuit board is about 4.2 mm. In this way, the width of the circuit board corresponding to each group of COFs is about 142.4 mm, and the distance b2 between the two adjacent circuit boards is 8.8 mm, the total length occupied by the circuit boards for the eight groups of COFs is 120.08 cm, which is less than the length of 121.76 cm of the 55-inch display panel.

In the technical solution of the embodiment, it is able to provide the COF required for the high resolution while satisfying the length requirement of the 55-inch display panel.

It should be appreciated that, there is a certain error in ACF adhering, typically +/−3 mm, and when all the COFs are equally spaced, the distance between two adjacent COFs is about 8.4 mm. In this way, the distance between each COF and the edge of its corresponding circuit board is 2.2 mm, which is less than the error in the ACF adhering, may cause the ACF to be adhered to the outer side of the circuit board, and thus affect the reliability of the display device. Therefore, in the technical solution of the embodiment, it is able to reduce the possibility of adhering the ACF to the outer side of the circuit board, and contribute to further improving the reliability of the display panel.

Furthermore, in other embodiments, the number of COFs in each group of chip on films may be further increased. For example, the COFs may be divided into four groups of COFs, six COFs for each group, and the minimum distance between COFs located in different groups is about 30.4 mm. However, an increased resistance difference between the fan-out regions corresponding to different COFs may occur, so as to affect the reliability of the display panel.

In some embodiments, a minimum distance between two adjacent ACFs is greater than 8 mm and less than 9 mm. In some embodiments, the minimum distance between two adjacent ACFs is controlled to be 8.8 mm. Thus, the error in the ACF adhering is sufficiently considered, so as to reduce a possibility that the ACFs overlaps each other, and make full use of the space of the display panel.

The embodiments of the present disclosure provide a method for bonding a display device, the display device includes a display panel and a plurality of COFs, and the method includes bonding the COFs to the display panel. The plurality of COFs are arranged along a first edge of the display panel, and divided into a plurality of groups of COFs, and each group of COFs includes at least two COFs, and bonded to the display panel through a same anisotropic conductive film.

In the technical solution of the embodiment, each group of COFs is bonded to the display panel through the same COF, and the formed display device may specifically refer to the above-mentioned embodiments of the display device, which will not be described in detail herein.

In some embodiments, the bonding the COFs to the display panel includes: bonding each group of COFs to the display panel by using one indenter through one pressing.

In the technical solution of the embodiment, each group of COFs is bonded to the display panel by using one indenter through one pressing. During an implementation, the indenter is adaptively adjusted based on an existing display panel production line.

Taking each group of COFs including three COFs as an example, each COF has a length of 42 mm, and the distance between two adjacent COFs is 4 mm. In this way, a total length of each group of COFs is 134 mm, a width of a required pressing position is about 140 mm. When eight groups of COFs are pressed simultaneously, a length of a required operation position is about 112 cm, which is less than the length of the 55-inch display panel. Therefore, it is able to provide a sufficient space to finish the bonding of the COFs to the display panel for the display panel with a diagonal length of 55 inches.

The technical solution of the embodiment may be modified on the basis of the existing production line, such as an existing 8.5-generation display panel production line, so as to implement a bonding process for a small-sized and high-resolution display panel, thereby to effectively save production costs.

The above are merely specific embodiments of the present disclosure, but a protection scope of the present disclosure is not limited thereto. Any modifications or replacements that would easily occurred to a person skilled in the art, without departing from the technical scope disclosed in the disclosure, should be encompassed in the protection scope of the present disclosure. Therefore, the protection scope of the present disclosure shall be subject to the protection scope of the claims.

What is claimed is:

1. A display device comprising a display panel and a plurality of chip on films arranged along a first edge of the display panel, the plurality of chip on films being divided into a plurality of groups of chip on films, and each group of chip on films comprising at least two chip on films, and being bonded to one or more circuit boards of the display panel at a fan-out region through a same anisotropic conductive film; each group of chip on films corresponds to one circuit board;
wherein the number of groups of the chip on films is an even number, the number of chip on films in each group of chip on films is equal, and the plurality of groups of chip on films are symmetrically distributed about a perpendicular bisector of the first edge;
wherein a diagonal length of a display area of the display panel is not greater than 60 inches, the number of pixels of the display panel in a first direction is greater than the number of pixels in a second direction, the first direction and the second direction are perpendicular to each other, and the number of pixels in the first direction is not less than 7600;
wherein a distance between the circuit boards is not less than 3.8 mm and not greater than 4.5 mm.

2. The display device according to claim 1, wherein the total number of chip on films is 24, and the number of chip on films in each group of chip on films is two or three.

3. The display device according to claim 2, wherein, in a same group of the chip on films, a distance between two adjacent chip on films is 3.8 mm to 4.2 mm.

4. The display device according to claim 3, wherein, in the same group of the chip on films, the distance between the two adjacent chip on films is 4 mm.

5. The display device according to claim 2, wherein in a case where each group of chip on films comprises two chip on films, a minimum distance between the chip on films of different groups is less than 13 mm and greater than 12.5 mm.

6. The display device according to claim 5, wherein the minimum distance between the chip on films of the different groups is 12.8 mm.

7. The display device according to claim 2, wherein in a case where each group of chip on films comprises three chip on films, a minimum distance between the chip on films of different groups is less than 17.5 mm and greater than 17 mm.

8. The display device according to claim 7, wherein the minimum distance between the chip on films of the different groups is 17.2 mm.

9. The display device according to claim 1, wherein a minimum distance between two adjacent anisotropic conductive films is greater than 8 mm and less than 9 mm.

10. The display device according to claim 9, wherein the minimum distance between two adjacent anisotropic conductive films is 8.8 mm.

11. A method for bonding a display device, the display device comprising a display panel and a plurality of chip on films, the method comprising:
bonding the chip on films to the display panel, wherein the plurality of chip on films are arranged along a first edge of the display panel, and divided into a plurality of groups of chip on films, and each group of chip on films comprises at least two chip on films, and is bonded to one or more circuit boards of the display panel at a fan-out region through a same anisotropic conductive film; each group of chip on films corresponds to one circuit board;
wherein the number of groups of the chip on films is an even number, the number of chip on films in each group of chip on films is equal, and the plurality of groups of chip on films are symmetrically distributed about a perpendicular bisector of the first edge;
wherein a diagonal length of a display area of the display panel is not greater than 60 inches, the number of pixels of the display panel in a first direction is greater than the number of pixels in a second direction, the first direction and the second direction are perpendicular to each other, and the number of pixels in the first direction is not less than 7600;
wherein a distance between the circuit boards is not less than 3.8 mm and not greater than 4.5 mm.

12. The method according to claim 11, wherein the bonding the chip on films to the display panel comprises:
bonding each group of chip on films to the display panel by using one indenter through one pressing.

13. The method according to claim 11, wherein the total number of chip on films is 24, and the number of chip on films in each group of chip on films is two or three.

14. The method according to claim 13, wherein, in a same group of the chip on films, a distance between two adjacent chip on films is 3.8 mm to 4.2 mm.

15. The method according to claim 14, wherein, in the same group of the chip on films, the distance between the two adjacent chip on films is 4 mm.

16. The method according to claim 13, wherein in a case where each group of chip on films comprises two chip on films, a minimum distance between the chip on films of different groups is less than 13 mm and greater than 12.5 mm.

17. The method according to claim 16, wherein the minimum distance between the chip on films of the different groups is 12.8 mm.

18. The method according to claim 13, wherein in a case where each group of chip on films comprises three chip on films, a minimum distance between the chip on films of different groups is less than 17.5 mm and greater than 17 mm.

19. The method according to claim 18, wherein the minimum distance between the chip on films of the different groups is 17.2 mm.

20. The method according to claim 11, wherein a minimum distance between two adjacent anisotropic conductive films is greater than 8 mm and less than 9 mm.

* * * * *